US006426292B2

(12) United States Patent
Vaartstra

(10) Patent No.: US 6,426,292 B2
(45) Date of Patent: Jul. 30, 2002

(54) METHODS FOR FORMING IRIDIUM AND PLATINUM CONTAINING FILMS ON SUBSTRATES

(75) Inventor: Brian A. Vaartstra, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/790,286

(22) Filed: Feb. 22, 2001

Related U.S. Application Data

(63) Continuation of application No. 09/148,089, filed on Sep. 3, 1998, now Pat. No. 6,239,028.

(51) Int. Cl.$^7$ .............................................. H01L 21/285
(52) U.S. Cl. .................................... 438/686; 427/126.5
(58) Field of Search ................................ 438/686, 682, 438/650, 652, 655, FOR 347; 427/99, 124, 126.5

(56) References Cited

U.S. PATENT DOCUMENTS

| | | |
|---|---|---|
| 3,839,164 A | 10/1974 | Hurst |
| 4,830,982 A | 5/1989 | Dentai et al. |
| 4,992,305 A | 2/1991 | Erbil |
| 5,096,737 A | 3/1992 | Baum et al. |
| 5,130,172 A | 7/1992 | Hicks et al. |
| 5,149,596 A | 9/1992 | Smith et al. |
| 5,187,638 A | 2/1993 | Sandhu et al. |
| 5,198,386 A | 3/1993 | Gonzalez |
| 5,220,044 A | 6/1993 | Baum et al. |
| 5,232,873 A | 8/1993 | Geva et al. |
| 5,252,518 A | 10/1993 | Sandhu et al. |
| 5,270,241 A | 12/1993 | Dennison et al. |
| 5,341,016 A | 8/1994 | Prall et al. |
| 5,354,712 A | 10/1994 | Ho et al. |
| 5,372,849 A | 12/1994 | McCormick et al. |
| 5,392,189 A | 2/1995 | Fazan et al. |
| 5,403,620 A | 4/1995 | Kaesz et al. |

(List continued on next page.)

FOREIGN PATENT DOCUMENTS

| | | |
|---|---|---|
| EP | 0 301 725 A2 | 2/1989 |
| EP | 0 770 862 | 5/1997 |
| JP | 9-162372 | 6/1997 |

OTHER PUBLICATIONS

Bhatt et al., "Novel high temperature multi–layered electrode barrier structure for high–density ferroelectric memories," *Appl. Phys. Lett.*, 71, 719–721 (1997).

Cohan et al., "Laser–assisted organometallic chemical vapor deposition of films of rhodium and iridium," *Appl. Phys. Lett.*, 60, 1402–1403 (1992).

Doppelt et al., "Mineral precursor for chemical vapor deposition of Rh metallic films," *Mater. Sci. Eng.*, 817, 143–146 (1993).

Etspuler et al., "Deposition of Thin Rhodium Films by Plasma–Enhanced Chemical Vapor Deposition," *Appl. Phys. A*, 48, 373–375 (1989).

Green et al., "Chemical Vapor Deposition of Ruthenium and Ruthenium Dioxide Films," *J. Electrochem. Soc.*, 132, 2677–2685 (1985).

(List continued on next page.)

Primary Examiner—George Fourson
(74) Attorney, Agent, or Firm—Mueting, Raasch & Gebhardt, P.A.

(57) ABSTRACT

A method of forming an iridium and platinum containing film on a substrate, such as a semiconductor wafer using complexes of the formula $L_yIrX_z$, wherein: each L group is independently a neutral or anionic ligand; each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group and X is a halide; y=1 to 4; z=1 to 4; x=0 to 3.

15 Claims, 3 Drawing Sheets

U.S. PATENT DOCUMENTS

| | | | |
|---|---|---|---|
| 5,464,786 | A | 11/1995 | Figura et al. |
| 5,478,772 | A | 12/1995 | Fazan |
| 5,480,684 | A | 1/1996 | Sandhu |
| 5,487,923 | A | 1/1996 | Min et al. |
| 5,498,562 | A | 3/1996 | Dennison et al. |
| 5,506,166 | A | 4/1996 | Sandhu et al. |
| 5,510,651 | A | 4/1996 | Maniar et al. |
| 5,520,992 | A | 5/1996 | Douglas et al. |
| 5,555,486 | A | 9/1996 | Kingon et al. |
| 5,561,307 | A | 10/1996 | Mihara et al. |
| 5,566,045 | A | 10/1996 | Summerfelt et al. |
| 5,581,436 | A | 12/1996 | Summerfelt et al. |
| 5,605,857 | A | 2/1997 | Jost et al. |
| 5,618,746 | A | 4/1997 | Hwang |
| 5,639,698 | A | 6/1997 | Yamazaki et al. |
| 5,654,222 | A | 8/1997 | Sandhu et al. |
| 5,654,224 | A | 8/1997 | Figura et al. |
| 5,661,115 | A | 8/1997 | Sandhu |
| 5,663,088 | A | 9/1997 | Sandhu et al. |
| 5,679,225 | A | 10/1997 | Pastacaldi et al. |
| 5,691,009 | A | 11/1997 | Sandhu |
| 5,696,384 | A | 12/1997 | Ogi et al. |
| 5,717,250 | A | 2/1998 | Schuele et al. |
| 5,728,626 | A | 3/1998 | Allman et al. |
| 5,744,832 | A | 4/1998 | Wolters et al. |
| 5,760,474 | A | 6/1998 | Schuele |
| 5,962,716 | A | 10/1999 | Uhlenbrock et al. |
| 5,970,378 | A | 10/1999 | Shue et al. |
| 5,972,105 | A | 10/1999 | Yamazaki et al. |
| 5,990,559 | A | 11/1999 | Marsh |
| 6,074,945 | A | 6/2000 | Vaartstra et al. |
| 6,127,257 | A | 10/2000 | Pintchovski et al. |
| 6,133,159 | A | 10/2000 | Vaartstra et al. |
| 6,218,297 | B1 | 4/2001 | Marsh |
| 6,239,028 | B1 | 5/2001 | Vaartstra |

OTHER PUBLICATIONS

Hoke et al., "Low–temperature Vapour Deposition of High–purity Iridium Coatings from Cyclooctadiene Complexes of Iridium," *J. Mater. Chem.*, 1, 551–554 (1991).

Hsu et al., "Synthesis and X–ray structure of the heteronuclear cluster, $(\mu-H)_2(\eta^5-C_5H_5)IrOs_3(CO)_{10}$," *Journal of Organometallic Chemistry*, 426, 121–130 (1992).

Johnson et al., "Chemistry," *Nature*, 901–902 (1967).

Kaesz et al., "Low–Temperature Organometallic Chemical Vapor Deposition of Transition Metals," *Mat. Res. Soc. Symp. Proc.*, 131, 395–400 (1989).

Khakani et al., "Pulsed laser deposition of highly conductive iridium oxide thin films," *Appl. Phys. Lett.*, 69, 2027–2029 (1991).

Kumar et al., "New precursors for organometallic chemical vapor deposition of rhodium," *Can. J. Chem.*, 69, 108–110 (1991).

Liao et al., "Characterization of $RuO_2$ thin films deposited on Si by metal–organic chemical vapor deposition," *Thin Solid Films*, 287, 74–79 (1996).

Lu et al., "Ultrahigh vacuum chemical vapor deposition of rhodium thin films on clean and $TiO_2$–covered Si(111)," *Thin Solid Films*, 208, 172–176 (1992).

Macchioni et al., "Cationic Bis– and Tris(η2–(pyrazol–1–yl)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997).

Macomber et al., "The Synthesis and $^1H$ NMR Study of Vinyl Organometallic Monomers: $(\eta^5-C_5H_4CH=CH_2)M(CO)_2(NO)$ (M=Cr, Mo, W) and $(\eta^5-C_5H_4CH=CH_2)M(CO)_2$ (M=Co, Rh, Ir)," *Journal of Organometallic Chemistry*, 250, 311–318 (1983).

Niemer, B., et al., "Organometallic chemical vapor deposition of tungsten metal and suppression of carbon incorporation by codeposition of platinum," *Appl. Phys. Letts.*, 61(15):1793–1795 (1992).

Pathangey et al., "Various approaches have been explored to obtain atomic layer controlled growth, but one of the most straightforward growth techniques is molecular beam epitaxy (MBE)," *Vacuum Technology and Coating*, 33–41 (May 2000).

Rausch et al., "Isolation and Structural Characterization of $Bis(\eta^5$–cyclopentadienyl)bis(carbonyl)–$\mu$–(o–phenylene)–diiridium (Ir–Ir), $(C_5H_5)_2Ir_2(C_6H_4)$: A Product Formally Derived from the Double Oxidative Addition of Benzene to Iridium," *J. Amer. Chem. Soc.*, 99, 7870–7876 (1977).

Smith et al., "Low–Temperature Chemical Vapor Depositon of Rhodium and Iridium Thin Films," *Mat. Res. Soc. Symp. Proc.*, 168, 369–374 (1990).

Suntola, "Atomic layer epitaxy," *Thin Solid Films*, 216, 84–89 (1992).

Takasu, Y., et al., "Preparation of a novel Pt–$RuO_2$/Ti electrocatalyst by use of highly porous ruthenium oxide support prepared from $RuO_2$–$La_2O_3$/electrode," *Journal of Alloys and Compounds*, 261, 172–175 (1997).

Uchida et al., "Preparation of organoiridium compound for metalorganic chemical vapor deposition (MOCVD) of thin film of iridium or iridium oxide," (Abstract of JP 08,306, 627) *CA Selects: Chemical Vapor Deposition*, 5, 1, Abstract No. 126:89572d (1997).

Van Hemert et al., "Vapor Deposition of Metals by Hydrogen Reduction of Metal Chelates," *J. Electrochem. Soc.*, 112, 1123–1126 (1965).

Versteeg et al., "Metalorganic Chemical Vapor Deposition by Pulsed Liquid Injection Using An Ultrasonic Nozzle: Titanium Dioxide on Sapphire from Titanium (IV) Isopropoxide," *J. Am. Ceram. Soc.*, 78, 2763–2768 (1995).

METHODS FOR FORMING IRIDIUM AND PLATINUM CONTAINING FILMS ON SUBSTRATES

This is a continuation of application Ser. No. 09/148,089, filed Sep. 3, 1998, now U.S. Pat. No. 6,239,028 which is incorporated herein by reference.

FIELD OF THE INVENTION

This invention relates to the preparation of iridium-containing films on substrates, particularly on semiconductor device structures.

BACKGROUND OF THE INVENTION

Films of metals and metal oxides, particularly the heavier elements of Group VIII, are becoming important for a variety of electronic and electrochemical applications. For example, high quality $RuO_2$ thin films deposited on silicon wafers have recently gained interest for use in ferroelectric memories. Many of the Group VIII metal films are generally unreactive toward silicon and metal oxides, resistant to diffusion of oxygen and silicon, and are good conductors. Oxides of certain of these metals also possess these properties, although perhaps to a different extent.

Thus, films of Group VIII metals and metal oxides, particularly the second and third row metals (e.g., Ru, Os, Rh, Ir, Pd, and Pt) have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors. Iridium oxide is of particular interest as a barrier layer because it is very conductive (30–60 $\mu\Omega$-cm) and is inherently a good oxidation barrier.

Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). It is important for device integrity that oxygen and/or silicon not diffuse into or out of the dielectric material. This is particularly true for ferroelectric RAMs because the stoichiometry and purity of the ferroelectric material greatly affect charge storage and fatigue properties.

Thus, there is a continuing need for methods and materials for the deposition of metal-containing films, such as iridium-containing films, which can funcation as barrier layers, for example, in integrated circuits, particularly in random access memory devices.

SUMMARY OF THE INVENTION

The present invention is directed to methods for manufacturing a semiconductor device, particularly a ferroelectric device. The methods involve forming iridium-containing films on substrates, such as semiconductor substrates or substrate assemblies during the manufacture of semiconductor structures. The iridium-containing film can be a pure iridium film, an iridium oxide film, an iridium silicide film, an iridium sulfide film, an iridium selenide film, an iridium nitride film, or the like. Typically and preferably, the iridium-containing film is electrically conductive. The resultant film can be used as a barrier layer or electrode in an integrated circuit structure, particularly in a memory device such as a ferroelectric memory device.

The metal-containing film can include pure iridium, or an iridium alloy containing iridium and one or more other metals (including transition metals, main group metals, lanthanides) or metalloids from other groups in the Periodic Chart, such as Si—, Ge, Sn, Pb, Bi, etc. Furthermore, for certain preferred embodiments, the metal-containing film can be an oxide, nitride, sulfide, selenide, silicide, or combinations thereof.

Thus, in the context of the present invention, the term "metal-containing film" includes, for example, relatively pure films of iridium, alloys of iridium with other Group VIII transition metals such as rhodium, nickel, palladium, platinum, iron, ruthenium, and osmium, metals other than those in Group VIII, metalloids (e.g., Si), or mixtures thereof. The term also includes complexes of iridium or iridium alloys with other elements (e.g., O, N, and S). The terms "single transition metal film" or "single metal film" refer to relatively pure films of iridium. The terms "transition metal alloy film" or "metal alloy film" refer to films of iridium in alloys with other metals or metalloids, for example.

One preferred method of the present invention involves forming a film on a substrate, such as a semiconductor substrate or substrate assembly during the manufacture of a semiconductor structure. The method includes: providing a substrate (preferably, a semiconductor substrate or substrate assembly); providing a precursor composition comprising one or more complexes of the formula:

$$L_y IrY_z,$$

(Formula I)

wherein: each L group is independently a neutral or anionic ligand; each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NRH_xR_{3-x}$, CNR, and RCN, wherein R is an organic group and X is a halide; y=1 to 4; z=1 to 4; x=0 to 3; and forming a metal-containing film from the precursor composition on a surface of the substrate (preferably, the semiconductor substrate or substrate assembly). In certain embodiments, the process is carried out in a nonhydrogen atmosphere (i.e., an atmosphere that does not include $H_2$). In other embodiments, L is not a cyclopentadienyl ligand when Y is a CO ligand. The metal-containing film can be a single transition metal film or a transition metal alloy film, for example. Using such methods, the complexes of Formula I are converted in some manner (e.g., decomposed thermally) and deposited on a surface to form a metal-containing film. Thus, the film is not simply a film of the complex of Formula I.

Complexes of Formula I are neutral complexes and may be liquids or solids at room temperature. Typically, however, they are liquids. If they are solids, they are preferably sufficiently soluble in an organic solvent or have melting points below their decomposition temperatures such that they can be used in flash vaporization, bubbling, microdroplet formation techniques, etc. However, they may also be sufficiently volatile that they can be vaporized or sublimed from the solid state using known chemical vapor deposition techniques. Thus, the precursor compositions of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing.

Yet another method of forming a metal-containing film on a substrate, such as a semiconductor substrate or substrate assembly during the manufacture of a semiconductor structure, involves: providing a substrate (preferably, a semiconductor substrate or substrate assembly); providing a precursor composition comprising one or more organic solvents and one or more precursor complexes of Formula I as defined above; vaporizing the precursor composition to form vaporized precursor composition; and directing the vaporized precursor composition toward the substrate to form a metal-containing film on a surface of the substrate. In certain embodiments, the process is carried out in a nonhydrogen-containing atmosphere. In other embodiments, L is not a cyclopentadienyl ligand when Y is a CO ligand. Herein, vaporized precursor composition includes vaporized molecules of precursor complexes of Formula I either alone or optionally with vaporized molecules of other compounds in the precursor composition, including solvent molecules, if used.

Preferred embodiments of the methods of the present invention involve the use of one or more chemical vapor deposition techniques, although this is not necessarily required. That is, for certain embodiments, sputtering, spin-on coating, etc., can be used.

Methods of the present invention are particularly well suited for forming films on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A chemical vapor deposition apparatus is also provided. The apparatus includes a deposition chamber having a substrate positioned therein; a vessel containing a precursor composition comprising one or more complexes of Formula I as described above; and a source of an inert carrier gas for transferring the precursor composition to the chemical vapor deposition chamber.

DETAILED DESCRIPTION OF PREFERRED EMBODIMENTS

Figure 1:
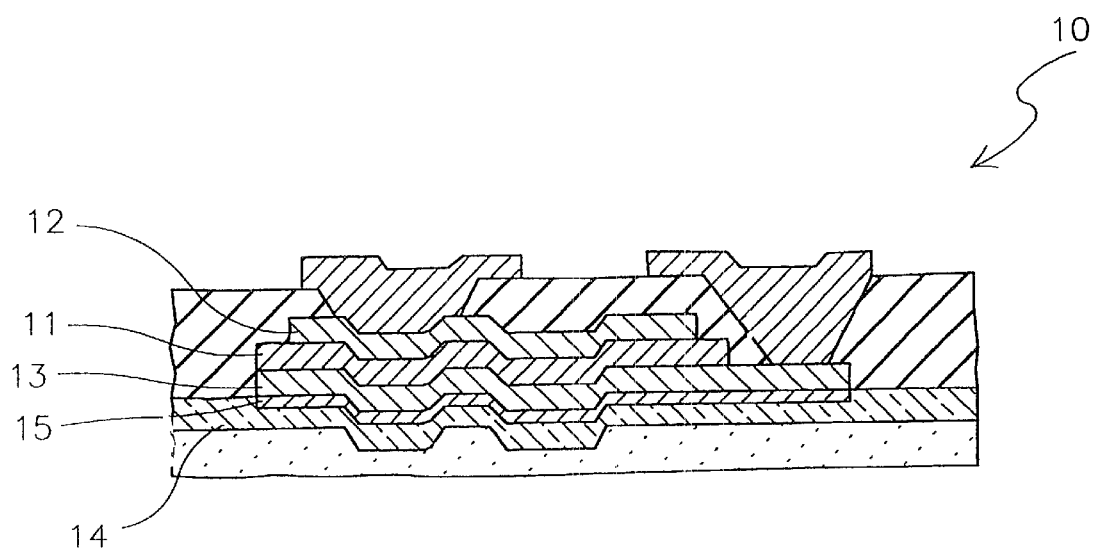
FIG. 1 is a cross-sectional schematic of a thin layer ferroelectric memory device having a conductive iridium-containing layer between the bottom electrode and underlying silicon-containing layers.

The present invention provides a method of forming an iridium-containing film, preferably an electrically conductive iridium-containing film, (e.g., pure iridium, iridium oxide, iridium sulfide, iridium selenide, iridium nitride, etc.). Specifically, the present invention is directed to a method of manufacturing a semiconductor device, particularly a ferroelectric device, having an iridium-containing film. The iridium-containing films formed are preferably conductive and can be used as barrier layers between the dielectric material and the silicon substrate in memory devices, such as ferroelectric memories, or as the plate (i.e., electrode) itself in the capacitors, for example. Because they are generally unreactive, such films are also suitable for use in optics applications as a reflective coating or as a high temperature oxidation barrier on carbon composites, for example. They can be deposited in a wide variety of thicknesses, depending on the desired use.

The present invention provides a method of forming a metal-containing film using one or more iridium complexes. These complexes are typically mononuclear (i.e., monomers in that they contain one metal per molecule), although they can be in the form of weakly bound dimers (i.e., dimers containing two monomers weakly bonded together through hydrogen or dative bonds). Herein, such monomers and weakly bound dimers are shown as mononuclear complexes.

The complexes of Formula I are neutral complexes and may be liquids or solids at room temperature. Typically, they are liquids. If they are solids, they are sufficiently soluble in an organic solvent to allow for vaporization, they can be vaporized or sublimed from the solid state, or they have melting temperatures below their decomposition temperatures. Thus, many of the complexes described herein are suitable for use in chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving substrate temperatures of about 200° C. to about 400° C.

The solvents that are suitable for this application can be one or more of the following: saturated or unsaturated linear, branched, or cyclic aliphatic (alicyclic) hydrocarbons ($C_3$–$C_{20}$, and preferably $C_5$–$C_{10}$) aromatic hydrocarbons ($C_5$–$C_{20}$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitrites, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. They are also generally compatible with each other, so that mixtures of variable quantities of the complexes will not interact to significantly change their physical properties.

One preferred method of the present invention involves vaporizing a precursor composition that includes one or more iridium complexes. Also, the precursor composition can include complexes containing other metals or metalloids.

The precursor composition can be vaporized in the presence of an inert carrier gas and/or a reaction gas to form a relatively pure iridium film, an iridium alloy film, or other iridium-containing film. The inert carrier gas is typically selected from the group consisting of nitrogen, helium, argon, and mixtures thereof In the context of the present invention, an inert carrier gas is one that is generally unreactive with the complexes described herein and does not interfere with the formation of an iridium-containing film. The reaction gas can be selected from a wide variety of gases reactive with the complexes described herein, at least at a surface under the conditions of chemical vapor deposition. Examples of reaction gases include hydrogen, oxidizing gases such as $H_2O$, $H_2O_2$, $O_2$, $O_3$, $N_2O$, $SO_3$, as well as $H_2S$, $H_2Se$, $SiH_4$, $NH_3$, $N_2H_4$, $Si_2H_6$. Preferably, the reaction gas is a nonhydrogen gas (i.e., a gas that is not $H_2$). Various combinations of carrier gases and/or reaction gases can be used in the methods of the present invention to form iridium-containing films. Thus, the iridium-containing film can include oxygen, sulfur, nitrogen, hydrogen, selenium, silicon, or combinations thereof. Such metal-containing films can be formed by subjecting a relatively pure metal film to subsequent processing, such as annealing or rapid thermal oxidation, to form other metal-containing films, such as oxides or silicides, for example.

The iridium complex is of the following formula, which is shown as a monomer, although weakly bound dimers are also possible:

(Formula I)

wherein: each L group is independently a neutral or anionic ligand; each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group and X is a halide; y=1 to 4 (preferably, 1); z=1 to 4 (preferably, 2 or 3, and more preferably, 2); and x=0 to 3.

Each L ligand is a neutral or anionic ligand, which can include pi bonding ligands. Preferably, L is selected from the group of dialkyl- and trialkylamines, polyamines (e.g., N,N,N'N'N"-pentamethyldiethylenetriamine, diethylenetriamine), trialkylphosphines, trialkylphosphites, ethers (including linear, branched, and cyclic ethers and polyethers), unsubstituted and fluoro-substituted linear, branched, and cyclic alkyls, substituted or unsubstituted linear, branched, or cyclic (alicyclic) alkenes (including monoenes, dienes, trienes, bicyclic alkenes, and polyenes, such as cyclopentadiene (Cp), cyclooctadiene, benzene, toluene, and xylene), substituted or unsubstituted linear, branched, and cyclic (alicyclic) alkynes, alkoxy groups (e.g., methoxy, ethoxy, isopropoxy), allyls, carboxylates, diketonates, thiolates, halides, substituted silanes (including alkoxy substituted silanes, alkyl substituted silanes, alkenyl substituted silanes), as well as oxo, nitrile, isonitrile, cyano, and carbonyl ligands. Various combinations of such L groups can be present in a molecule. For certain embodiments, at least two different ligands are present in each complex. Preferably, L is methylcyclopentadienyl and Y is carbonyl or nitrosyl; however, for certain embodiments, L is not a cyclopentadienyl ligand when Y is a carbonyl ligand.

Preferably, each R group in the complexes of Formula I is a ($C_1$–$C_8$) organic group. More preferably, each R group is a ($C_1$–$C_5$) organic group. Most preferably, each R group is a ($C_1$–$C_4$) alkyl moiety.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present invention, the organic groups are those that do not interfere with the formation of a metal-containing film. Preferably, they are of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Substitution is anticipated on the organic groups of the complexes of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

A preferred class of complexes of Formula I include $(RC_5H_4)Ir(CO)_2$, where 'R' represents one or more substituents such as methyl, ethyl, vinyl, etc. on the cyclopentadienyl group (Cp). This class of complexes of Formula I is particularly advantageous because they are liquids and can be delivered to the CVD chamber using simple bubbler techniques.

Various combinations of the complexes described herein can be used in a precursor composition. Thus, as used herein, a "precursor composition" refers to a liquid or solid that includes one or more complexes of the formulas described herein optionally mixed with one or more complexes of formulas other than those of Formula I. The precursor composition can also include one or more organic solvents suitable for use in a chemical vapor deposition system, as well as other additives, such as free ligands, that assist in the vaporization of the desired compounds.

The complexes described herein can be used in precursor compositions for chemical vapor deposition. Alternatively, certain complexes described herein can be used in other deposition techniques, such as sputtering, spin-on coating, and the like. Typically, those complexes containing R groups with a low number of carbon atoms (e.g., 1–4 carbon atoms per R group) are suitable for use with vapor deposition techniques. Those complexes containing R groups with a higher number of carbon atoms (e.g., 5–12 carbon atoms per R group) are generally suitable for spin-on or dip coating. Preferably, however, chemical vapor deposition techniques are desired because they are more suitable for deposition on semiconductor substrates or substrate assemblies, particularly in contact openings which are extremely small and require conformally filled layers of metal.

For the preparation of iridium alloy films, at least one complex of Formula I can be combined with another complex in a precursor composition. For example, $CpIr(CO)_2$ can be combined with $CpPtMe_3$ to form an Ir/Pt alloy.

The complexes used in the present invention can be prepared by a variety of methods known to one of skill in the art. For example, $(C_5H_5)Ir(CO)_2$ can be prepared by reaction of chlorotricarbonyl iridium(I) with cyclopentadienyl-lithium in THF solvent.

As stated above, the use of the iridium complexes and methods of forming conductive iridium-containing films of the present invention are beneficial for a wide variety of thin film applications in integrated circuit structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a film formed from the complexes of the present invention would be useful is the ferroelectric memory cell 10 of FIG. 1. The memory cell 10 includes a ferroelectric material 11, such as a lead zirconate titanate (PZT) or lithium niobate film, between two electrodes 12 and 13, which are typically made of platinum, although other metals such as gold or aluminum can also be used. The bottom electrode 13 is typically in contact with a silicon-containing layer 14, such as an n-type or p-type silicon substrate, silicon dioxide, glass, etc. A conductive iridium-containing layer 15 prepared from a complex of Formula I is positioned between the bottom electrode 13 and the silicon-containing layer 14 to act as a barrier to diffusion of atoms such as silicon into the electrode and ferroelectric material. Alternatively, or additionally, the two electrodes can be made of iridium using a complex of Formula I.

Methods of the present invention can be used to deposit a metal-containing film, preferably a metal or metal alloy film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The film is deposited upon decomposition (typically, thermal decomposition) of a complex of Formula I, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 2:
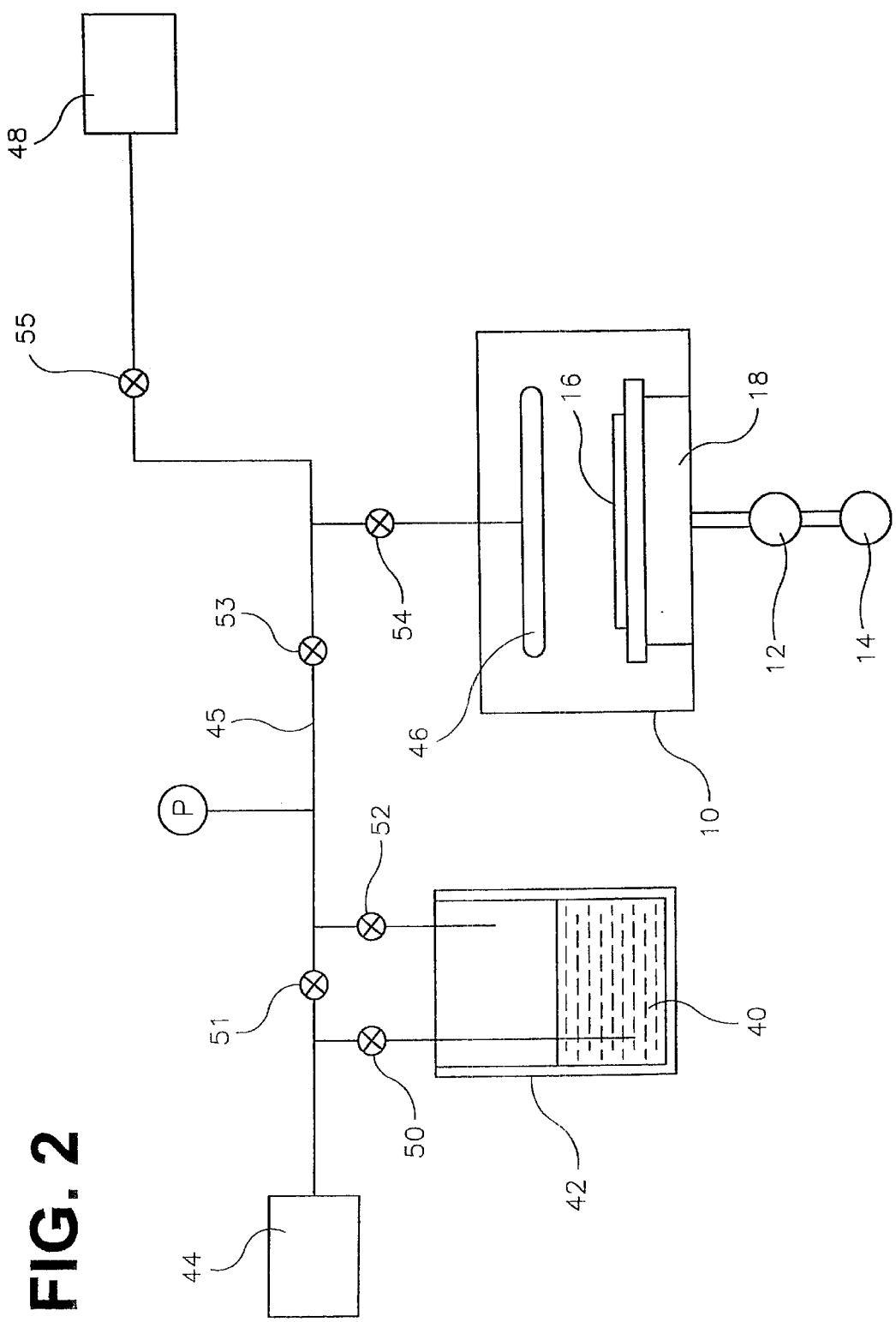
FIG. 2 is a schematic of a chemical vapor deposition system suitable for use in the method of the present invention.

A typical chemical vapor deposition (CVD) system that can be used to perform the process of the present invention is shown in FIG. 2. The system includes an enclosed chemical vapor deposition chamber 10, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 100° C. to about 600° C., and more preferably at a temperature of about 200° C. to about 400° C. Substrate 16 may be heated, for example, by an electrical resistance heater 18 on which substrate 16 is mounted. Other known methods of heating the substrate may also be utilized.

In this process, the precursor composition 40, which contains one or more complexes of Formula I (and/or other metal or metalloid complexes), is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. Valves 50–55 are opened and closed as required.

Generally, the precursor composition, and optional reaction gases, are pumped into the CVD chamber 10 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 10, the precursor composition will form an adsorbed layer on the surface of the substrate 16. As the deposition rate is temperature dependent in a certain temperature range, increasing the temperature of the substrate will increase the rate of deposition. Typical deposition rates are about 10 Angstroms/minute to about 1000 Angstroms/minute. The carrier gas containing the precursor composition is terminated by closing valve 53.

Figure 3:
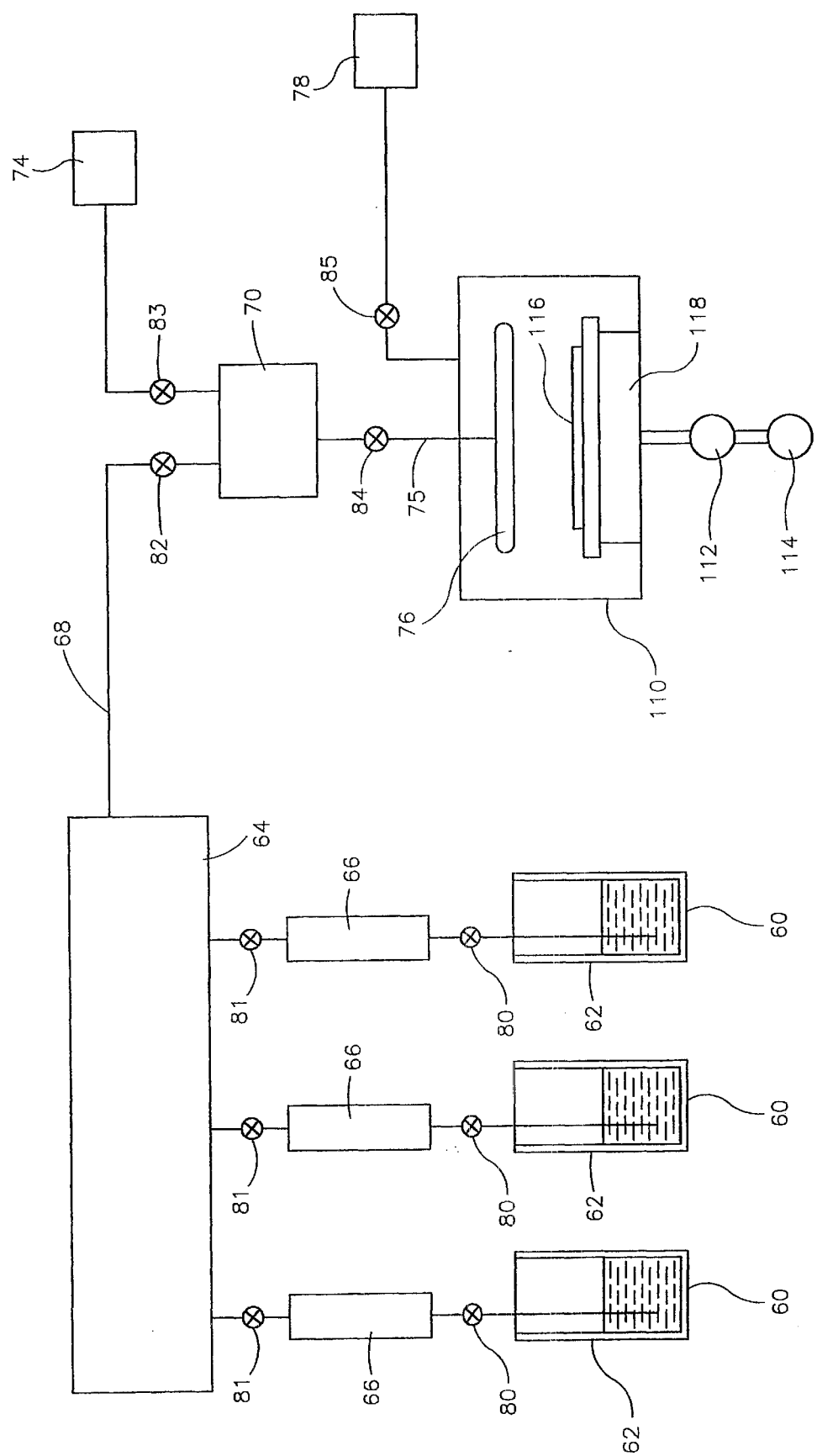
FIG. 3 is a schematic of an alternative chemical vapor deposition system suitable for use in the method of the present invention.

An alternative CVD system that can be used to perform the process of the present invention is shown in FIG. 3. The system includes an enclosed chemical vapor deposition chamber 110, which may be a cold wall-type CVD reactor, in which a vacuum may be created using turbo pump 112 and backing pump 114. One or more substrates 116 (e.g., semiconductor substrates or substrate assemblies) are positioned in chamber 110. Substrate 116 may be heated as described with reference to FIG. 2 (for example, by an electrical resistance heater 118).

In this process, one or more solutions 60 of one or more precursor complexes of Formula I (and/or other metal or metalloid complexes), are stored in vessels 62. The solutions are transferred to a mixing manifold 64 using pumps 66. The resultant precursor composition containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 110 through line 75 and gas distributor 76. Reaction gas may be supplied from source 78 as needed. As shown, a series of valves 80–85 are opened and closed as required. Similar pressures and temperatures to those described with reference to FIG. 2 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition. Although specific vapor deposition processes are described by reference to FIGS. 2–3, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

EXAMPLES

The following examples are offered to further illustrate the various specific and preferred embodiments and techniques. It should be understood, however, that many variations and modifications may be made while remaining within the scope of the present invention.

Synthesis of $\{(CH_3)C_5H_4\}Ir(CO)_2$

In an inert-atmosphere glove box, a flask was charged with 2.0 g (6.4 mmol) of chlorotricarbonyliridium (I) (Strem Chemicals, Inc., Newburyport, Mass.). The compound was suspended in 100 mL of hexanes and stirred during the addition of a solution of methylcyclopentadienyl lithium (12.8 mL of 0.5 M in THF). The flask was equipped with a condenser and the mixture was refluxed for 24 hours. The solvent was then removed in vacuo. The crude product was purified by vacuum distillation; an orange colored liquid product collected was at 58° C. at approximately 200 mTorr. The product was characterized by IR and NMR spectroscopy.

CVD of an Iridium Film

A substrate of silicon that had been thermally oxidized was placed into a CVD chamber and heated to 300° C. A bubbler containing $\{(CH_3)C_5H_4\}Ir(CO)_2$ was connected such that carrier gas would pass through the liquid precursor and take vapor of the compound into the chamber. The bubbler was heated to 40° C. and the lines connecting the bubbler to the chamber were heated to 50° C. to prevent condensation. Using a carrier gas flow of 20 sccm He, an oxygen gas flow (plumbed to the chamber via a separate line) of 50 sccm, and a chamber pressure of 3 torr, a film was deposited for 4 minutes. The film was highly reflective, conductive (850Ω/sq), and was confirmed to be polycrystalline iridium metal by X-ray diffraction.

CVD of an Iridium Oxide Film

A substrate of silicon that had been thermally oxidized was placed into a CVD chamber and heated to 255° C. A bubbler containing $\{(CH_3)C_5H_4\}Ir(CO)_2$ was connected such that carrier gas would pass through the liquid precursor and take vapor of the compound into the chamber. The bubbler was heated to 40° C. and the lines connecting the bubbler to the chamber were heated to 50° C. to prevent condensation. Using a carrier gas flow of 10 sccm He, an oxygen gas flow (plumbed to the chamber via a separate line) of 100 sccm, and a chamber pressure of 5 torr, a film was deposited for 5 minutes. The film was found by scanning electron microscopy to be 1000 Angstroms thick and was confirmed to be polycrystalline iridium oxide by X-ray diffraction.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure, the method comprising:
   providing a semiconductor substrate or substrate assembly; providing a precursor composition comprising one or more complexes of the formula:

$$L_yIrY_z,$$

wherein:
   each L group is independently a neutral or anionic ligand;
   each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide, and
   x=0 to 3;
   y=1 to 4; and
   z=1 to 4; and providing a precursor composition comprising one or more platinum complexes; and forming a platinum-iridium-containing film from the precursor composition on a surface of the semiconductor substrate or substrate assembly.

2. The method of claim 1 wherein the step of forming a platinum-iridium-containing film comprises vaporizing the precursor compositions and directing them toward the semiconductor substrate or substrate assembly using a chemical vapor deposition technique.

3. The method of claim 1 wherein the precursor composition comprising one or more platinum complexes is of the formula $L_yPtY_z$ wherein $L_y$ and $Y_z$ are the chosen to be the same as in the precursor composition $L_yIrY_z$.

4. The method of claim 1 wherein the semiconductor substrate is a silicon wafer or a gallium arsenide wafer.

5. The method of claim 1 wherein the precursor compositions are each liquids.

6. The method of claim 5 wherein the liquid precursor compositions comprise a solid dissolved in a solvent.

7. The method of claim 1 wherein the precursor compositions are vaporized in the presence of a carrier gas.

8. The method of claim 1 wherein the precursor compositions are vaporized in the presence of a reaction gas.

9. The method of claim 1 wherein the platinum precursor composition comprises $CpPt(Me)_3$, wherein Me is a methyl group and Cp is cyclopentadienyl.

10. A method of forming a film on a substrate, the method comprising:

providing a substrate;

providing a precursor composition comprising one or more complexes of the formula:

$$L_yIrY_z,$$

wherein:
each L group is independently a neutral or anionic ligand;
each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide, and
x=0 to 3;
y=1 to 4; and
z=1 to 4; and providing a precursor composition comprising one or more platinum complexes; and;

forming a platinum-iridium-containing film from the precursor composition on a surface of the substrate.

11. The method of claim 10 wherein forming a platinum-iridium-containing film comprises vaporizing the precursor compositions and directing them toward the substrate using a chemical vapor deposition technique.

12. The method of claim 10 wherein the platinum precursor composition comprises $CpPt(Me)_3$, wherein Me is a methyl group and Cp is cyclopentadienyl.

13. The method of claim 1 wherein each R group is a $C_1$–$C_8$ organic group.

14. The method of claim 13 wherein each R group is a $C_1$–$C_5$ organic group.

15. The method of claim 14 wherein each R group is a $C_1$–$C_4$ organic moiety.

* * * * *

UNITED STATES PATENT AND TRADEMARK OFFICE
CERTIFICATE OF CORRECTION

PATENT NO.    : 6,426,292 B2
DATED         : July 30, 2002
INVENTOR(S)   : Vaartstra It is certified that error appears in the above-identified patent and that said Letters Patent is hereby corrected as shown below:

Column 2,
Line 42, delete "$NRH_xR_{3-x}$" and insert -- $NH_xR_{3-x}$. --

Column 5,
Line 11, after "thereof" please insert -- . --;

Column 9,
Line 60, delete "$\{(CH_3)C_3H_4\}Ir(CO)_2$" and insert -- $\{(CH_3)C_5H_4\}Ir(CO)_2$ --;

Column 11,
Line 4, delete "composition" and insert -- compositions --; and

Column 12,
Line 17, delete "composition" and insert -- compositions --.

Signed and Sealed this

Sixth Day of May, 2003

JAMES E. ROGAN
*Director of the United States Patent and Trademark Office*